United States Patent
Chen et al.

(10) Patent No.: US 12,289,868 B2
(45) Date of Patent: Apr. 29, 2025

(54) SYSTEMS AND METHODS FOR COOLING A FLUID CIRCUIT FOR COOLING A RACK OF SERVERS

(71) Applicant: Quanta Computer Inc., Taoyuan (TW)

(72) Inventors: Chao-Jung Chen, Taoyuan (TW);
Yu-Nien Huang, Taoyuan (TW);
Sin-Hong Lien, Taoyuan (TW);
Jen-Mao Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/435,866

(22) Filed: Feb. 7, 2024

(65) Prior Publication Data

US 2024/0179875 A1 May 30, 2024

Related U.S. Application Data

(62) Division of application No. 17/387,415, filed on Jul. 28, 2021, now Pat. No. 11,937,405.

(60) Provisional application No. 63/182,357, filed on Apr. 30, 2021.

(51) Int. Cl.
*H05K 7/20* (2006.01)

(52) U.S. Cl.
CPC ..... *H05K 7/20663* (2013.01); *H05K 7/20327* (2013.01); *H05K 7/20354* (2013.01); *H05K 7/202* (2013.01)

(58) Field of Classification Search
CPC ........... H05K 7/20663; H05K 7/20327; H05K 7/20354; H05K 7/202; H05K 7/20654; H05K 7/20772
See application file for complete search history.

(56) References Cited

U.S. PATENT DOCUMENTS

| | | | |
|---|---|---|---|
| 5,057,968 A | 10/1991 | Morrison | |
| 9,494,371 B2 | 11/2016 | Werner et al. | |
| 9,759,457 B1 | 9/2017 | Gillooly | |
| 10,912,230 B1 | 2/2021 | Gao | |
| 11,665,865 B1 * | 5/2023 | Gregory | H05K 7/20381 361/679.53 |
| 2004/0065095 A1 | 4/2004 | Osborne et al. | |

(Continued)

FOREIGN PATENT DOCUMENTS

TW M583071 U 9/2019

OTHER PUBLICATIONS

TW Office Action for Application No. 110147481, mailed May 3, 2022, w/ First Office Action Summary.

(Continued)

*Primary Examiner* — David J Teitelbaum
(74) *Attorney, Agent, or Firm* — NIXON PEABODY LLP

(57) ABSTRACT

A system includes a rack of servers and a fluid circuit for cooling the rack of servers. The fluid circuit includes one or more cooling modules, a heat-exchanging module, and a pump. The one or more cooling modules are thermally connected to a conduit for flowing a coolant therethrough. Each cooling module includes a heat-exchanger thermally connected to the conduit and a chiller fluidly coupled to the heat-exchanger. The heat-exchanging module is fluidly connected to an outlet of the conduit. The pump is configured to drive the coolant from the heat-exchanging module to each server in the rack of servers.

18 Claims, 9 Drawing Sheets

(56) References Cited

U.S. PATENT DOCUMENTS

| | | | |
|---|---|---|---|
| 2007/0074537 A1* | 4/2007 | Bean | F25B 41/00 |
| | | | 62/513 |
| 2007/0227710 A1* | 10/2007 | Belady | H05K 7/2079 |
| | | | 165/122 |
| 2008/0123288 A1* | 5/2008 | Hillis | H05K 7/20745 |
| | | | 361/679.54 |
| 2009/0100848 A1* | 4/2009 | Kuriyama | F28F 17/005 |
| | | | 62/132 |
| 2009/0262495 A1 | 10/2009 | Neudorfer | |
| 2011/0100618 A1 | 5/2011 | Carlson | |
| 2013/0135805 A1* | 5/2013 | Wang | G06F 1/185 |
| | | | 361/679.02 |
| 2018/0299933 A1* | 10/2018 | Cui | H05K 7/20772 |
| 2018/0372385 A1* | 12/2018 | Cline | F25B 25/005 |

OTHER PUBLICATIONS

TW Search Report for Application No. 110147481, mailed May 3, 2022, w/ First Office Action.

* cited by examiner

SYSTEMS AND METHODS FOR COOLING A FLUID CIRCUIT FOR COOLING A RACK OF SERVERS

CROSS-REFERENCE TO RELATED APPLICATIONS

This application is a divisional of U.S. patent application Ser. No. 17/387,415, filed on Jul. 28, 2021, now allowed, which claims priority from and benefit of U.S. Provisional Application No. 63/182,357, filed on Apr. 30, 2021, each of which is hereby incorporated by reference herein in its entirety.

FIELD OF THE INVENTION

The present invention relates generally to systems and methods for cooling computing systems, and more specifically, systems and methods for cooling a fluid circuit used for cooling a rack of servers.

BACKGROUND OF THE INVENTION

Computing devices (such as servers) typically contain one or more heat-generating components, such as a central processing unit (CPU), a graphics processing unit (GPU), and others. To aid in cooling these heat-generating components, fluid circuits having heat-exchanging components for transferring heat away from the heat-generating components may be used. However, the coolant may become heated before it reaches the heat-generating components that are spatially distant from the heat-exchanging components. Thus, additional cooling of the coolant may become necessary to maintain the temperature of the coolant, before it reaches the heat-generating components.

Accordingly, it is desirable to have better cooling solutions that can maintain sufficiently low temperature of the coolant in the fluid circuits, such that heat from the heat-generating components in all parts of the computing device can continue to be effectively removed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a fluid circuit for cooling a rack of servers is disclosed. The fluid circuit includes a conduit and one or more cooling modules thermally connected to the conduit. The conduit is configured to flow a coolant therethrough. Each cooling module includes a heat-exchanger thermally connected to the conduit and a chiller fluidly coupled to the heat-exchanger.

According to certain aspects of the present disclosure, a system includes a rack of servers and a fluid circuit for cooling the rack of servers. The fluid circuit includes one or more cooling modules, a heat-exchanging module, and a pump. The one or more cooling modules are thermally connected to a conduit for flowing a coolant therethrough. Each cooling module includes a heat-exchanger thermally connected to the conduit and a chiller fluidly coupled to the heat-exchanger. The heat-exchanging module is fluidly connected to an outlet of the conduit. The pump is configured to drive the coolant from the heat-exchanging module to each server in the rack of servers.

According to certain aspects of the present disclosure, each cooling modules further includes an inlet pipe for delivering a cooling fluid from the chiller to the heat-exchanger and an outlet pipe for removing the cooling fluid from the heat-exchanger to the chiller.

According to certain aspects of the present disclosure, the cooling fluid is water delivered at a temperature of less than about 10 degrees Celsius.

According to certain aspects of the present disclosure, each cooling module further comprises a pump fluidly coupled to the inlet pipe for driving the cooling fluid from the chiller to the heat-exchanger.

According to certain aspects of the present disclosure, the chiller in each cooling module further includes a manifold, a radiator, a compressor, and an expansion valve. The manifold is configured to circulate a refrigerant for cooling the cooling fluid. The radiator is coupled to the manifold and configured to remove heat from the refrigerant flowing through the manifold. The compressor is coupled to the manifold and configured to drive the refrigerant into the radiator. The expansion valve is coupled to the manifold and configured to control flow of the refrigerant from the radiator to the compressor.

According to certain aspects of the present disclosure, the heat-exchanging module is a rear-door heat exchanger disposed on a rear surface of the rack of servers and coupled to a plurality of fans.

According to certain aspects of the present disclosure, the heat-exchanging module is placed within a cooling distribution unit disposed in the rack of servers and the heat-exchanging module is a radiator coupled to a plurality of fans.

According to certain aspects of the present disclosure, the fluid circuit includes a temperature sensor coupled to an outlet channel of the conduit and configured to measure temperature of the coolant flowing out of the conduit.

According to certain aspects of the present disclosure, a method of cooling a fluid circuit configured to cool a rack of servers is disclosed. The method includes measuring temperature of a coolant flowing into a conduit of the fluid circuit, and determining whether the temperature of the coolant is greater than a temperature of a chiller fluidly coupled to a heat-exchanger in a cooling module thermally connected to the fluid circuit via the conduit. The method further includes operating the chiller to deliver a cooling fluid from the chiller to the heat-exchanger, in response to the temperature of the coolant being greater than the temperature of the chiller.

According to certain aspects of the present disclosure, the temperature of the coolant is measured using a waterproof temperature sensor coupled to an outlet channel of the conduit.

According to certain aspects of the present disclosure, the cooling fluid is water delivered at a temperature of less than about 10 degrees Celsius.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
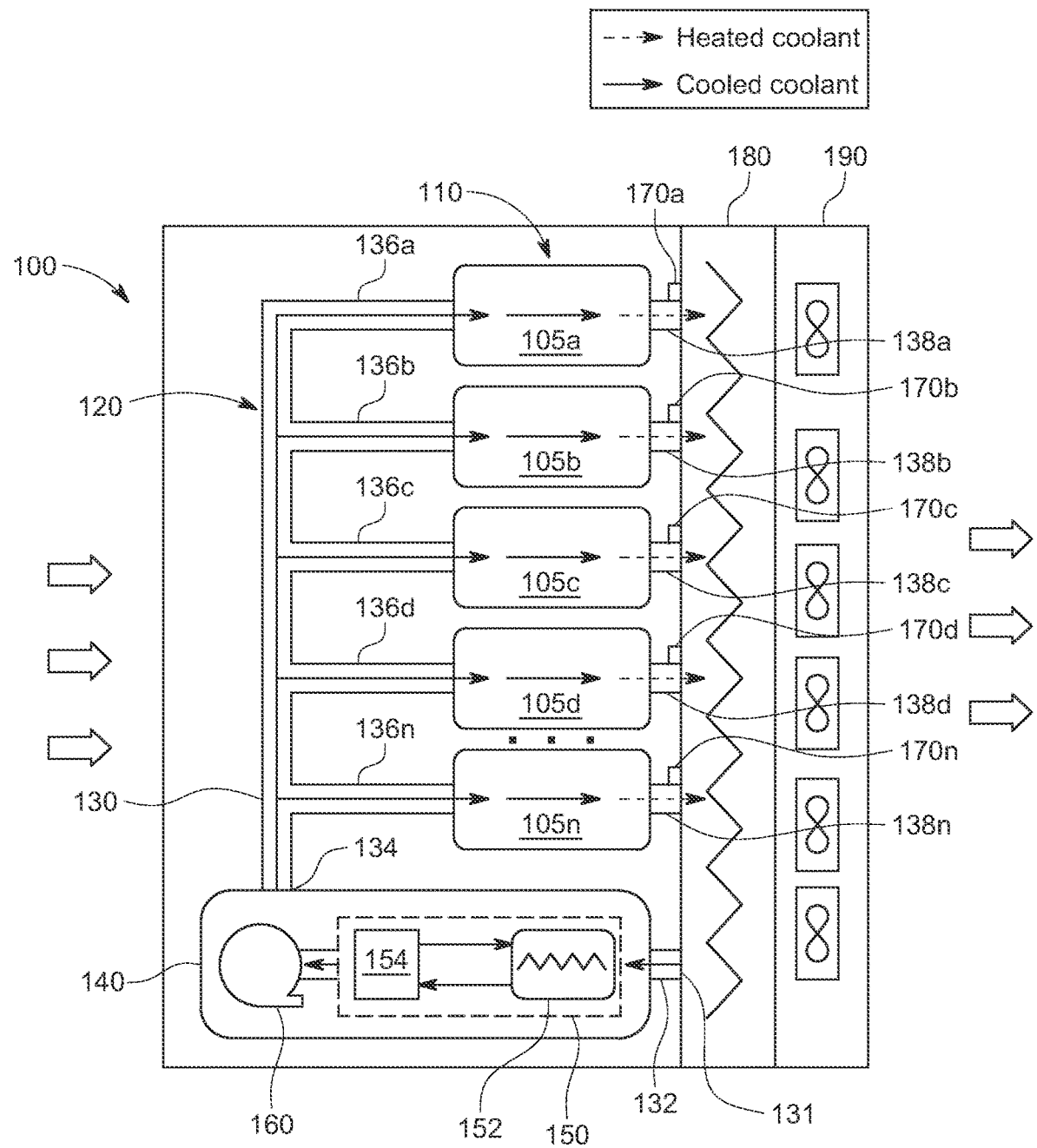
FIG. 1A shows a side view of a schematic depiction of a system having a first embodiment of a fluid circuit for cooling a rack of servers, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to systems and methods for cooling a fluid circuit used for cooling a rack of servers. The fluid circuits include one or more cooling modules thermally connected to a conduit for circulating a coolant in the fluid circuit. Each cooling module includes a heat-exchanger thermally connected to the conduit and a chiller fluidly coupled to the heat exchanger. When temperature of the coolant flowing out of the conduit is determined to be greater than a particular value (e.g., a starting temperature of the chiller at 40 degrees Celsius, standby temperature of the chiller at 35 degrees Celsius), the chiller is turned on and operated to cool the coolant in the fluid circuit. This ensures that the temperature of the coolant remains sufficiently low, before it reaches each of the servers in the rack.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
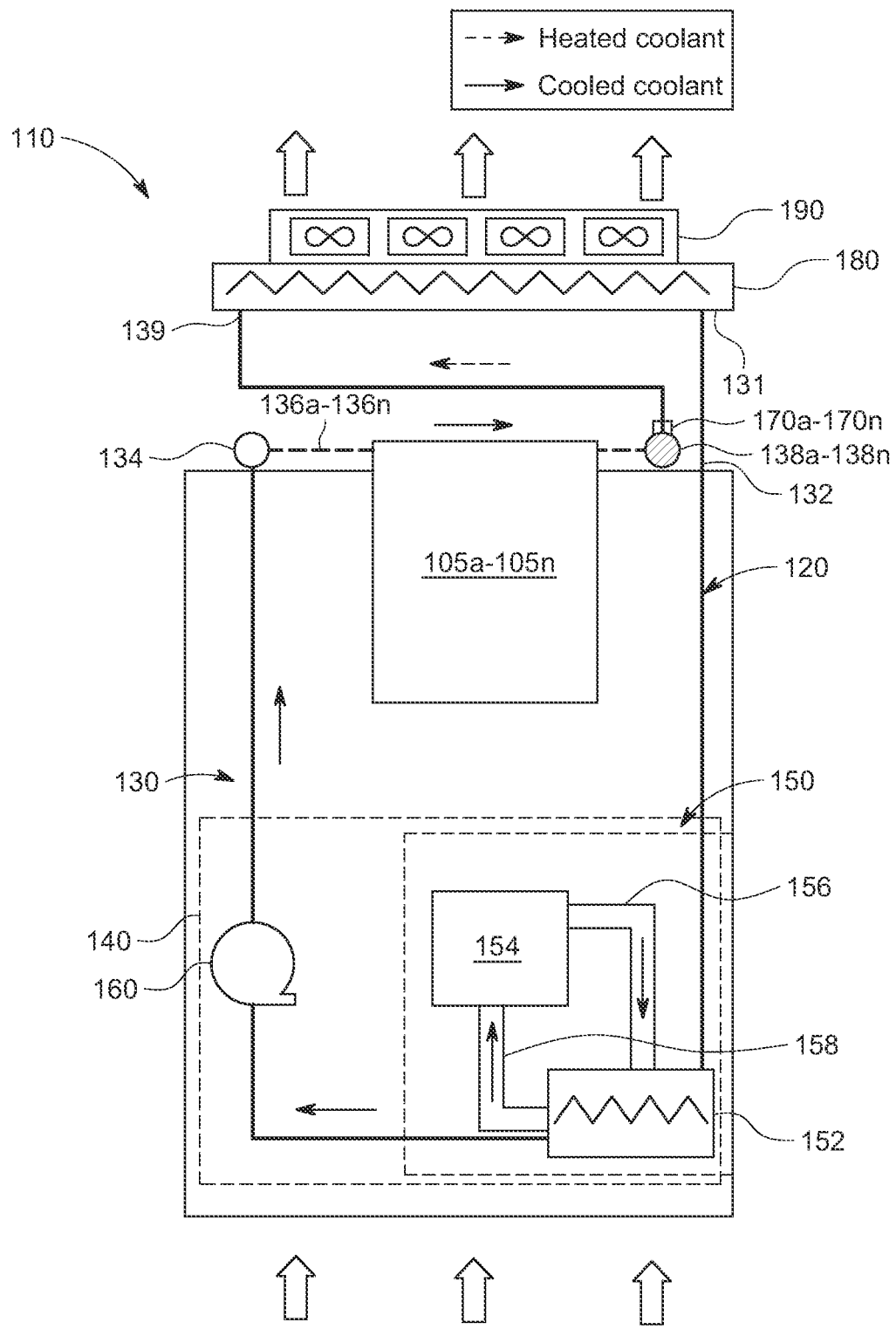
FIG. 1B shows a top view of the fluid circuit of FIG. 1A, according to certain aspects of the present disclosure.
Figure 1C:
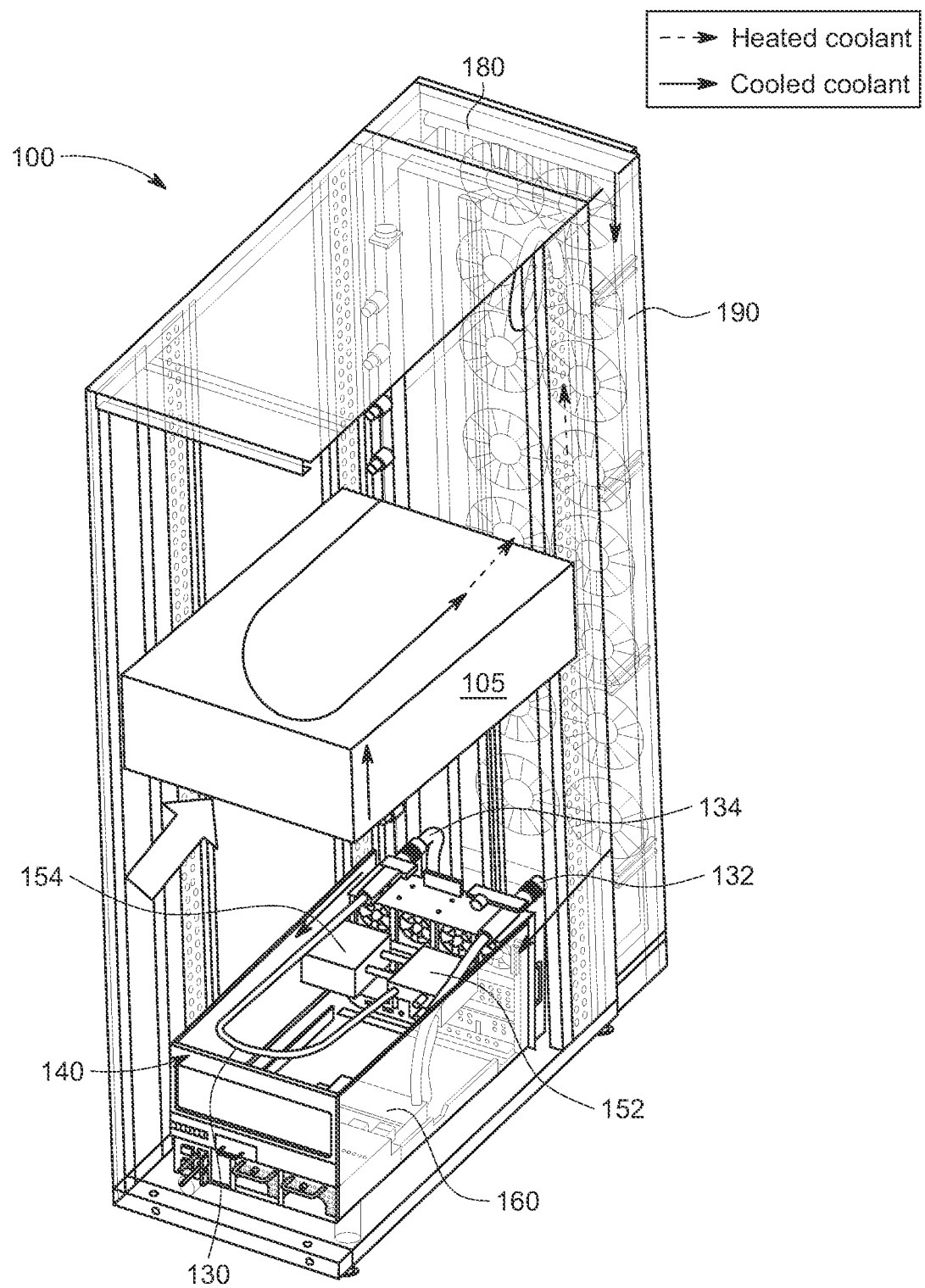
FIG. 1C shows a perspective view of the system and the rack of servers of FIG. 1A, according to certain aspects of the present disclosure.

FIGS. 1A-1B show side and top views of a schematic depiction of a system 100 having a first embodiment of a fluid circuit 120 for cooling a rack 110 of 'n' servers 105a, 105b, . . . , 105n, while FIG. 1C shows a perspective view of the system 100 and the rack 110 of FIG. 1A. The letter 'n' is used throughout this specification to denote a plurality of components and represents an integer greater than two. The flow of air through the rack 110 is denoted by block arrows, while the flow of heated coolant and cooled coolant is denoted by dashed arrows and straight arrows respectively, as shown in the indexes of FIGS. 1A-1C.

The system 100 includes the fluid circuit 120 for cooling the rack 110. A coolant such as, but not limited to, propylene glycol heat transfer fluid (PG-25) flows through a conduit 130 of the fluid circuit 120 and removes heat from each of the servers 105a, 105b, . . . , 105n in the rack 110. The fluid circuit 120 also includes a cooling distribution unit 140 and a heat-exchanging module 180. The cooling distribution unit 140 is configured to controllably distribute the coolant in the fluid circuit 120. The heat-exchanging module 180 is fluidly connected to the conduit 130 and configured to deliver cooled coolant into the conduit 130.

The conduit 130 has an inlet 131 through which the cooled coolant from the heat-exchanging module 180 enters an inlet channel 132, which fluidly connects to the cooling distribution unit 140 of the fluid circuit 120. The conduit 130 has a distribution channel 134 coming out of the cooling distribution unit 140. The distribution channel 134 branches into individual feeding channels 136a, 136b, . . . , 136n for the respective servers 105a, 105b, . . . , 105n. The coolant is distributed by the cooling distribution unit 140 through the distribution channel 134 and the individual feeding channels 136a, 136b, . . . , 136n into the respective servers 105a, 105b, . . . , 105n. The conduit 130 has outlet channels 138a, 138b, . . . , 138n coming out of the respective servers 105a, 105b, . . . , 105n. The coolant carrying heat from the heat-generating components (e.g., a processor, memory card, etc.) of the servers 105a, 105b, . . . , 105n flows through the outlet channels 138a, 138b, . . . , 138n and out of an outlet 139 into the heat-exchanging module 180.

In the embodiment shown in FIGS. 1A-1C, the heat-exchanging module 180 is a rear-door heat exchanger disposed on a rear surface (not shown) of the rack 110. The heat-exchanging module 180 is coupled to a plurality of fans 190 configured to remove heat from the coolant in the heat-exchanging module 180. Temperature sensors 170a, 170b, . . . , 170n are thermally coupled to the respective outlet channels 138a, 138b, . . . , 138n and configured to measure the temperature of the coolant flowing out of the conduit 130 and into the heat-exchanging module 180. In some embodiments, the temperature sensors 170a, 170b, . . . , 170n are waterproof in nature.

The cooling distribution unit 140 includes a pump 160 and one or more cooling modules 150. Each cooling module 150 is thermally connected to the fluid circuit 120 via the conduit 130 and the pump 160 within the cooling distribution unit 140. The pump 160 is configured to drive the cooled coolant from the heat-exchanging module 180 through the distribution channel 134 and the individual feeding channels 136a, 136b, . . . , 136n to each server 105n in the rack 110.

Figure 3:
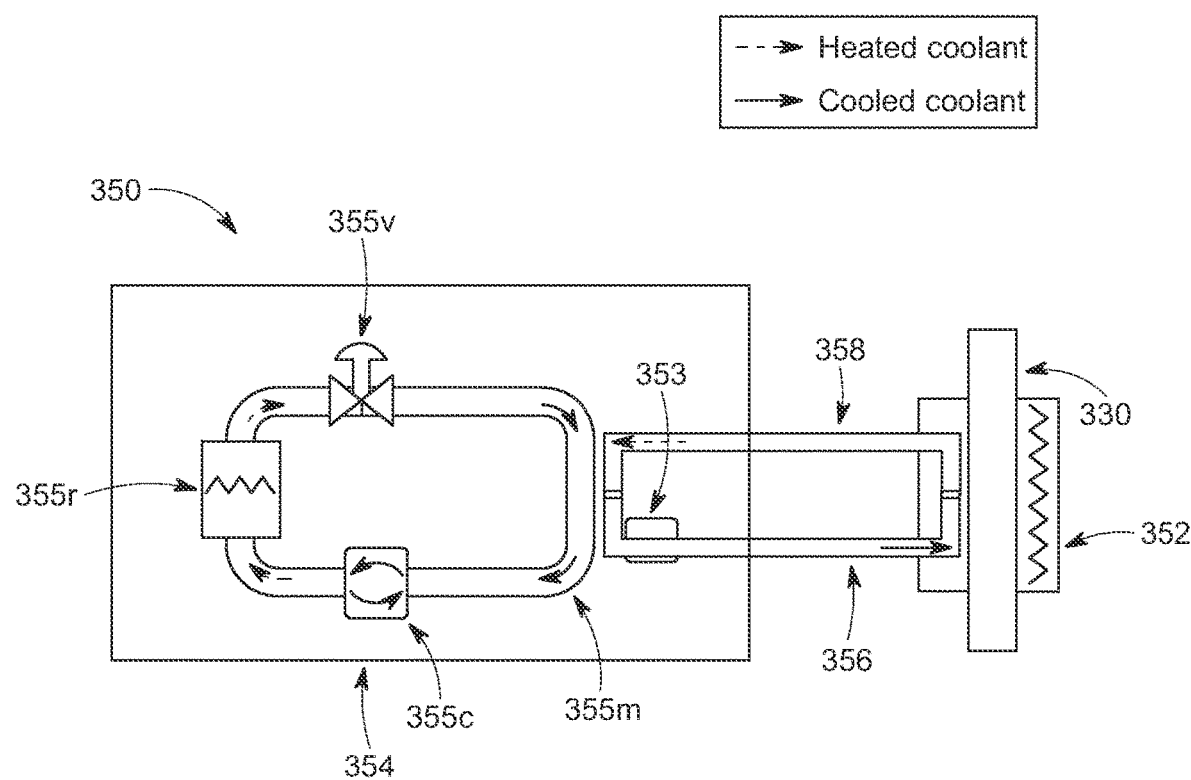
FIG. 3 shows a schematic depiction of a cooling module thermally connected to a fluid circuit for cooling a rack of servers, according to certain aspects of the present disclosure.

Each cooling module 150 includes a heat-exchanger 152 thermally connected to the conduit 130 and a chiller 154 fluidly connected to the heat-exchanger 152. An inlet pipe 156 is configured to deliver a cooling fluid from the chiller 154 to the heat-exchanger 152, while an outlet pipe 158 is configured to remove the cooling fluid from the heat-exchanger 152 to the chiller 154. In some embodiments, the chiller 154 is operated and controlled by a control unit (not shown) within the cooling distribution unit 140. Further details on the operation of the chiller 154 are shown in FIG. 3 and described below. In some embodiments, the cooling fluid is iced water or water delivered at a temperature of less than about 10 degrees Celsius.

Figure 2A:
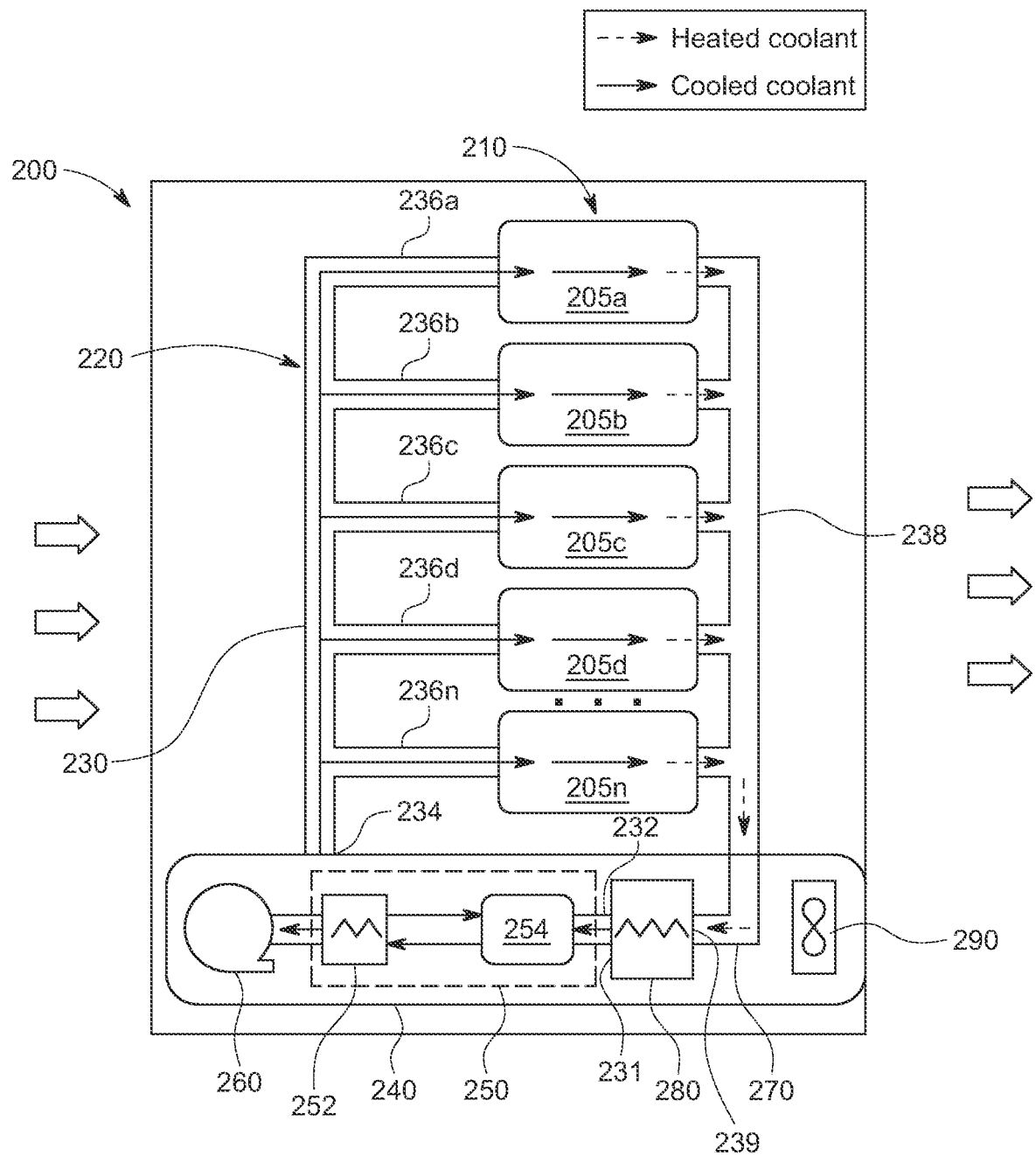
FIG. 2A shows a side view of a schematic depiction of a system having a second embodiment of a fluid circuit for cooling a rack of servers, according to certain aspects of the present disclosure.
Figure 2B:
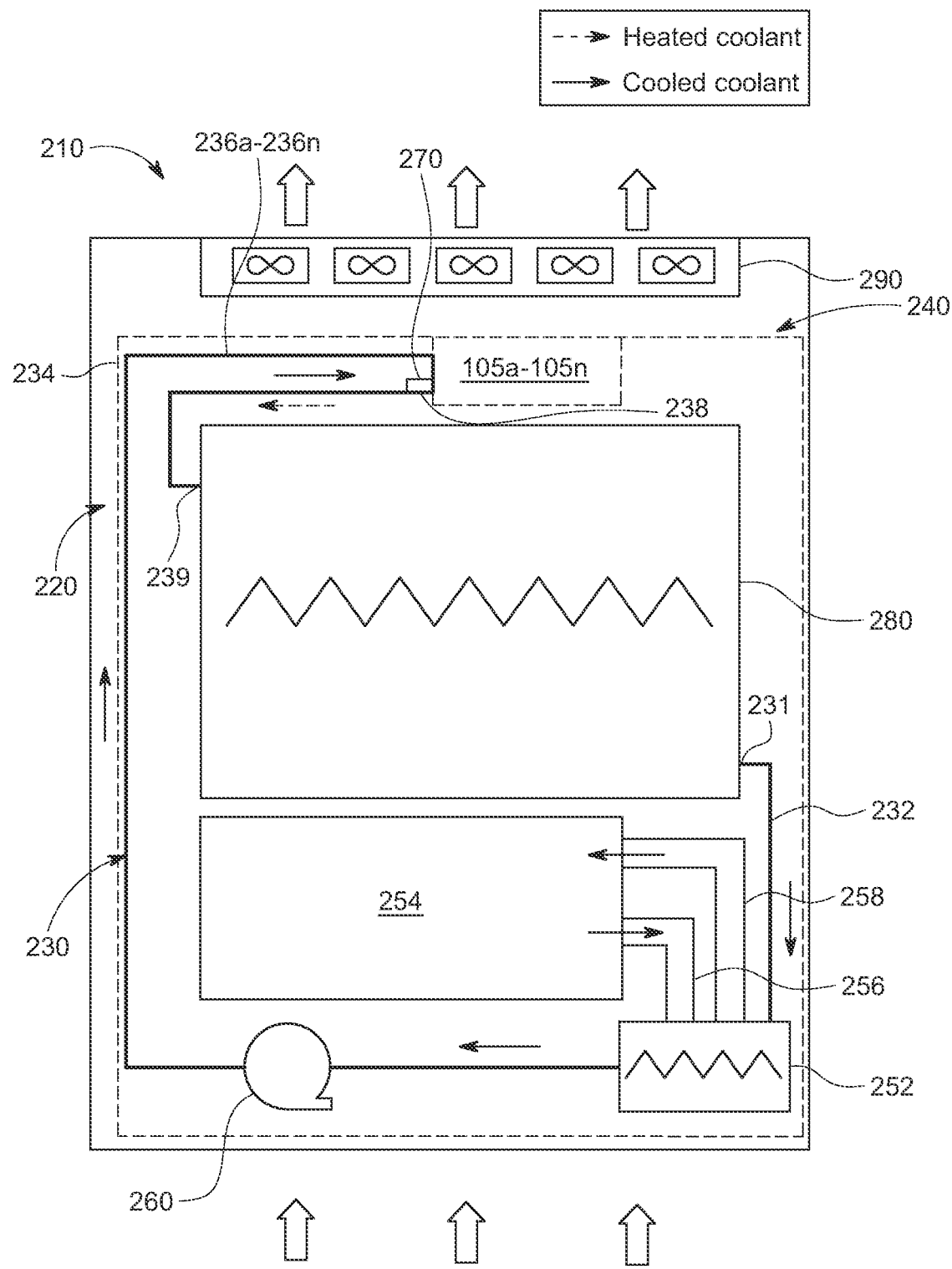
FIG. 2B shows a top view of the fluid circuit of FIG. 2A, according to certain aspects of the present disclosure.
Figure 2C:
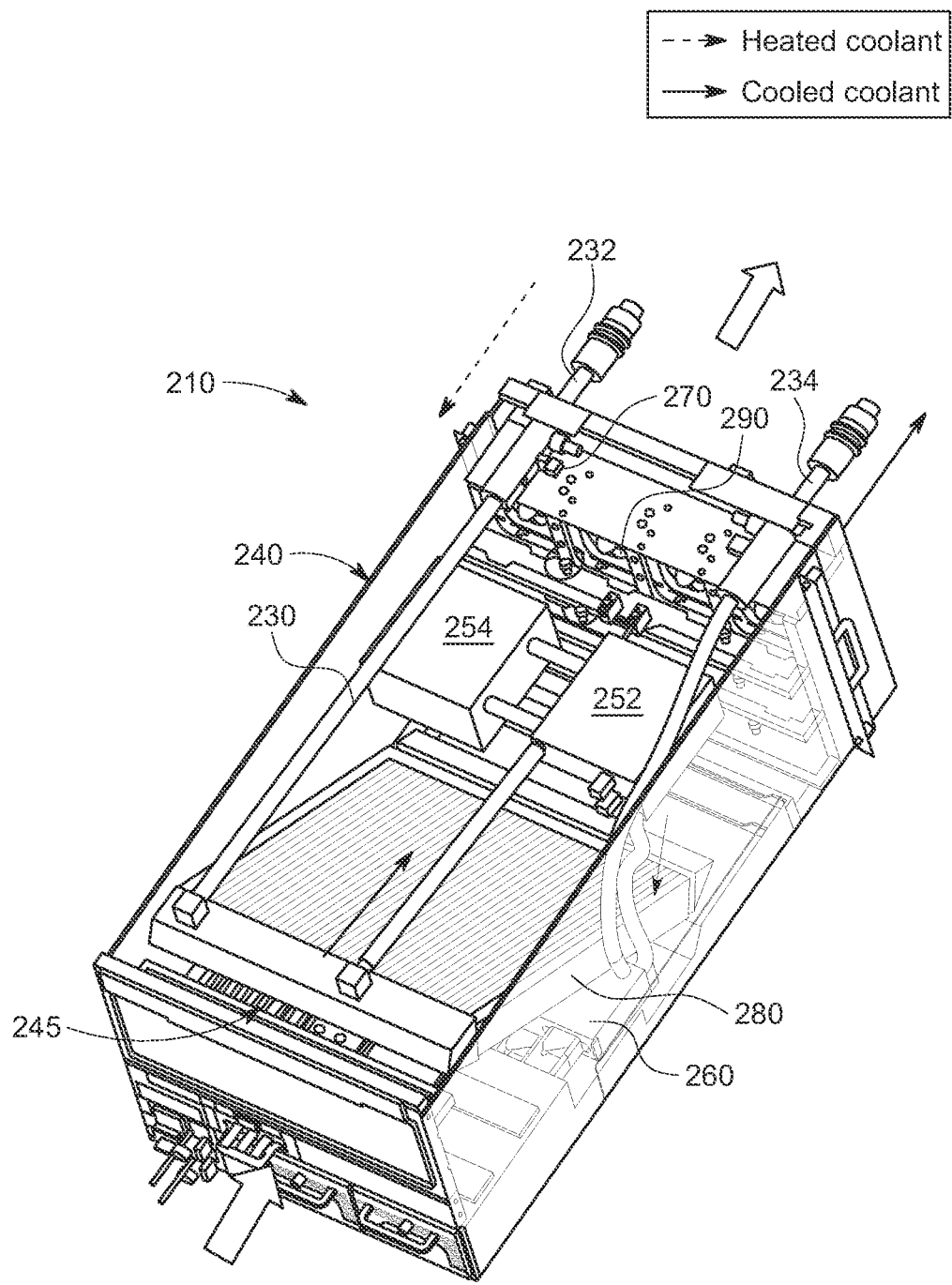
FIG. 2C shows a perspective view of a cooling distribution unit configured to be disposed in the rack of FIG. 2A, according to certain aspects of the present disclosure.

FIGS. 2A-2B shows side and top views of a schematic depiction of a system 200 having a second embodiment of a fluid circuit 220 for cooling a rack 210 of 'n' servers 205a, 205b, . . . , 205n, while FIG. 2C shows a perspective view of a cooling distribution unit 240 configured to be disposed in the rack 210 of FIG. 2A. The flow of air through the rack 210 is denoted by block arrows, while the flow of heated coolant and cooled coolant is denoted by dashed arrows and straight arrows respectively, as shown in the indexes of FIGS. 2A-2C.

The system 200 includes a fluid circuit 220 for cooling the rack 210. A coolant such as, but not limited to, propylene glycol heat transfer fluid (PG-25) flows through a conduit 230 of the fluid circuit 220 and removes heat from each of the servers 205a, 205b, . . . , 205n in the rack 210. The fluid circuit 220 also includes a cooling distribution unit 240 having a heat-exchanging module 280 placed therein. The cooling distribution unit 240 is configured to controllably distribute the coolant in the fluid circuit 220. The heat-exchanging module 280 is a radiator fluidly connected to the conduit 230 and configured to deliver cooled coolant into the conduit 230. The heat-exchanging module 280 is coupled to a plurality of fans 290 configured to remove heat from the coolant in the heat-exchanging module 280.

The conduit 230 has an inlet 231 through which the cooled coolant from the heat-exchanging module 280 enters an inlet channel 232, which fluidly connects to the cooling distribution unit 240. The conduit 230 has a distribution channel 234 coming out of the cooling distribution unit 240. The distribution channel 234 branches into individual feeding channels 236a, 236b, . . . , 236n for the respective servers 205a, 205b, . . . , 205n. The coolant is distributed by the cooling distribution unit 240 through the distribution channel 234 and the individual feeding channels 236a, 236b, . . . , 236n into the respective servers 205a, 205b, . . . , 205n. The conduit 230 has an outlet channel 238 for receiving heated coolant out of the respective servers 205a, 205b, . . . , 205n. The coolant carrying heat from the heat-generating components (e.g., a processor, memory card, etc.) of the servers 205a, 205b, . . . , 205n flows through the outlet channel 238 and out of an outlet 239 into the heat-exchanging module 280. A temperature sensor 270 is thermally coupled to the outlet channel 238 and configured to measure the temperature of the coolant flowing out of the conduit 230 and into the heat-exchanging module 280. In some embodiments, the temperature sensor 270 is waterproof in nature.

The cooling distribution unit 240 includes a pump 260 and one or more cooling modules 250. Each cooling module 250 is thermally connected to the fluid circuit 220 via the conduit 230 and the pump 260 within the cooling distribution unit 240. The pump 260 is configured to drive the cooled coolant from the heat-exchanging module 280 through the distribution channel 234 and the individual feeding channels 236a, 236b, . . . , 236n to each server 205n in the rack 210.

Each cooling module 250 includes a heat-exchanger 252 thermally connected to the conduit 230 and a chiller 254 fluidly connected to the heat-exchanger 252. An inlet pipe 256 is configured to deliver a cooling fluid from the chiller 254 to the heat-exchanger 252, while an outlet pipe 258 is configured to remove the cooling fluid from the heat-exchanger 252 to the chiller 254. In some embodiments, the chiller 254 is operated and controlled by a control unit 245 (FIG. 2C) within the cooling distribution unit 240. Further details on the operation of the chiller 254 are shown in FIG. 3 and described below. In some embodiments, the cooling fluid is iced water or water delivered at a temperature of less than about 10 degrees Celsius.

FIG. 3 shows a schematic depiction of a cooling module 350 thermally connected to a conduit 330 of a fluid circuit (e.g. the fluid circuit 120 in FIGS. 1A-1B). The cooling module 350 is substantially similar in structure and function to the cooling modules 150 (FIGS. 1A-1C), 250 (FIGS. 2A-2C). The cooling module 350 includes a heat-exchanger 352 thermally connected to a conduit 330 carrying a coolant. The conduit 330 is substantially similar in structure and function to the conduits 130 (FIGS. 1A-1C), 230 (FIGS.

2A-2C). The cooling module also includes a chiller 354 fluidly coupled to the heat-exchanger 352 through an inlet pipe 356 and an outlet pipe 358. The inlet pipe 356 is configured to deliver a cooled cooling fluid from the chiller 354 to the heat-exchanger 352. The outlet pipe 358 is configured to remove the heated cooling fluid from the heat-exchanger 352 to the chiller 354. A pump 353 is fluidly coupled to the inlet pipe 356 for driving the cooling fluid from the chiller 354 to the heat-exchanger 352

The chiller 354 has a manifold 355m for circulating a refrigerant to cool the cooling fluid flowing between the chiller 354 and the heat-exchanger 352. A radiator 355r is coupled to the manifold 355m and configured to remove heat from the refrigerant flowing through the manifold 355m. A compressor 355c is coupled to the manifold 355m and configured to drive the refrigerant into the radiator 355r. An expansion valve 355v is coupled to the manifold 355m and configured to generate a low temperature refrigerant gas. In operation, the heat from the heated cooling fluid is absorbed by the refrigerant in the manifold 355m. The compressor 355c compresses the heated refrigerant gas from the manifold 355m into liquid phase and drives the heated refrigerant to the radiator 355r. The heat in the heated refrigerant is removed by the radiator 355r, which significantly lowers the temperature of the refrigerant in the manifold 355m such that the refrigerant is maintained at a sufficiently low temperature and the heated cooling fluid flowing between the chiller 354 and the heat-exchanger 352 is cooled.

Figure 4:
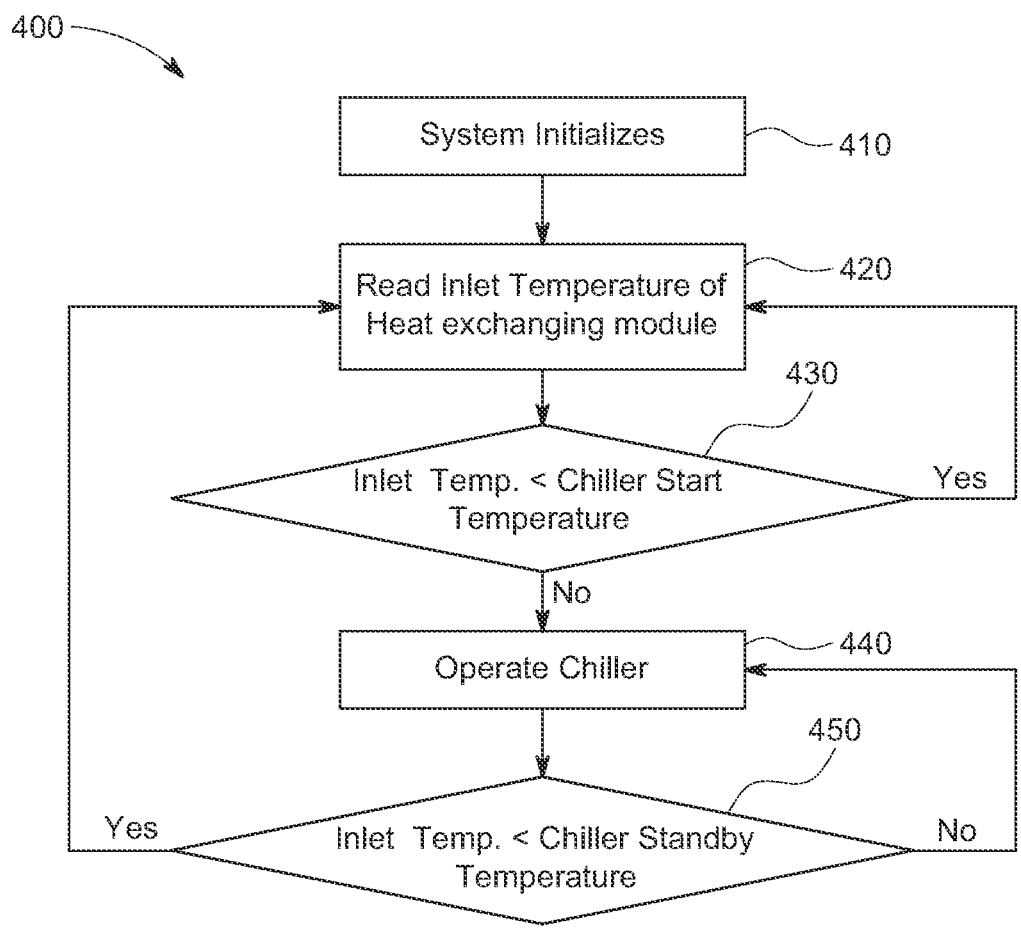
FIG. 4 shows a flow diagram of operation of the cooling module of FIG. 3, according to certain aspects of the present disclosure.

FIG. 4 shows a flow diagram of the operation of the cooling module 350 (e.g., cooling module 350 in FIG. 3) executed by a control unit (e.g., control unit 245 in FIG. 2C) in the cooling distribution unit of a server. In some embodiments, the control unit may be a baseboard management controller (BMC) in each server or computing system. In other embodiments, the control unit could be a rack control unit (RCU) mounted on a rack of servers. The operation starts in step 410, where the system initializes. At this time, the chiller in the cooling module remains in standby mode. In step 420, an inlet temperature of the heat-exchanging module is read. In some embodiments, the inlet temperature of the heat-exchanging module corresponds to the temperature of a coolant at an outlet of a conduit in the fluid circuit of the system. The temperature of the coolant flowing out of the conduit is measured using a temperature sensor coupled to the outlet of the conduit.

At decision point 430, the control unit determines whether the inlet temperature of the heat-exchanging module is less than a starting temperature of the chiller (e.g., 40 degrees Celsius). If the inlet temperature of the heat-exchanging module is less than the starting temperature of the chiller, then the system returns to step 420 to read the inlet temperature of the heat-exchanging module.

On the other hand, if the inlet temperature of the heat-exchanging module is not less than, i.e. greater than the starting temperature of the chiller, then in step 440, the chiller is operated to cool down the temperature of the coolant through the conduit, and consequently, at the inlet temperature of the heat-exchanging module.

Subsequently, at decision point 450, the control unit determines whether the inlet temperature of the heat-exchanging module is less than a standby temperature of the chiller (e.g., 35 degrees Celsius). If the inlet temperature of the heat-exchanging module is less than the standby temperature of the chiller, then chiller is turned off and the system returns to step 420 to continue reading the inlet temperature of the heat-exchanging module. On the other hand, if the inlet temperature of the heat-exchanging module is not less than, i.e. greater than the standby temperature of the chiller, then the system returns to step 440 to operate the chiller.

Figure 5:
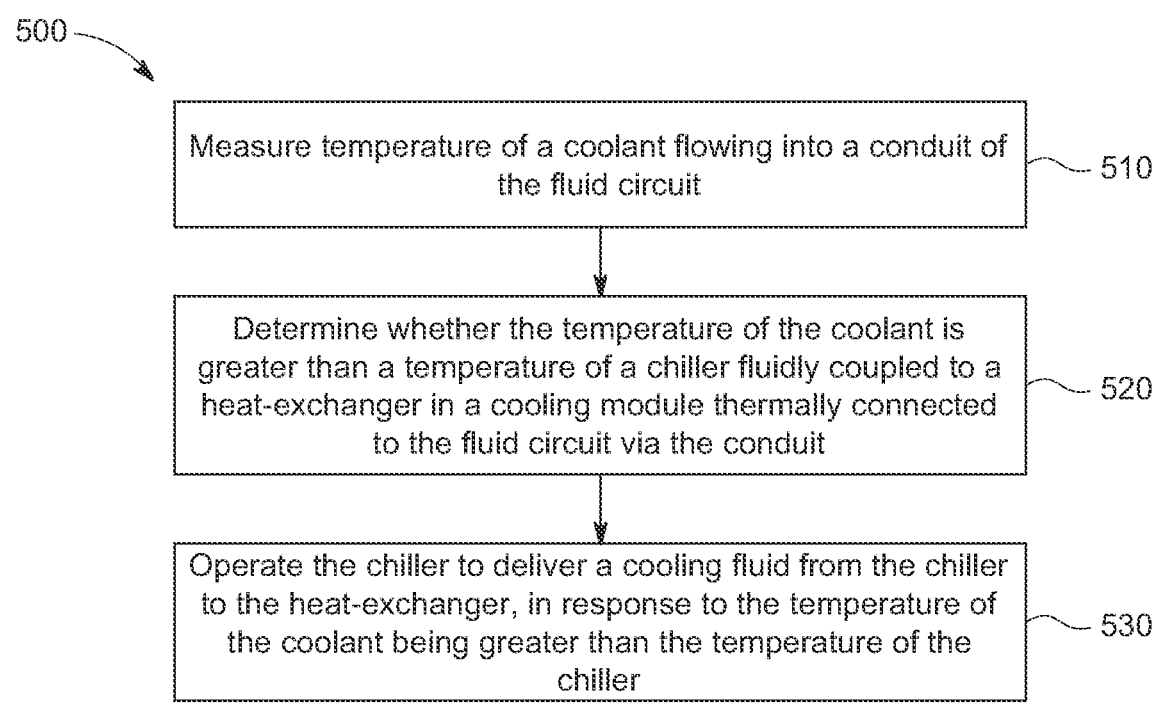
FIG. 5 shows a block diagram of a method of cooling a fluid circuit configured to cool a rack of servers, according to certain aspects of the present disclosure.

FIG. 5 shows a block diagram 500 of a method of cooling a fluid circuit configured to cool a rack of servers. The method begins in block 510, where a temperature of a coolant flowing into a conduit of the fluid circuit is measured. The temperature of the coolant is measured using a waterproof temperature sensor coupled to an outlet of the conduit. In some embodiments, the coolant is propylene glycol.

In block 520, the method determines whether the temperature of the coolant is greater than a temperature of a chiller. The chiller is fluidly coupled to a heat-exchanger in a cooling module thermally connected to the fluid circuit via the conduit. A control unit disposed in the rack of servers and communicatively coupled to the cooling module is configured to determine whether the temperature of the coolant is greater than the temperature of the chiller.

In block 530, the chiller is operated to deliver a cooling fluid from the chiller to the heat-exchanger, in response to the temperature of the coolant being greater than the temperature of the chiller. The operation of the chiller is initiated by the control unit disposed in the rack of servers. In some embodiments, the cooling fluid is water delivered at a temperature of less than about 10 degrees Celsius.

Advantageously, the cooling modules with the chiller and the heat-exchanger described herein enhances the thermal performance of the coolant in the fluid circuit serving the rack of servers. Incorporation of the cooling module with the chiller and the heat-exchanger in the fluid circuit removes about 10000 Watts of heat from the fluid circuit 120 of the system 100 (FIGS. 1A-1B) and about 2000 Watts of heat from the fluid circuit 220 of the system 200 (FIGS. 2A-2B). This represents about 30.7% and about 24.2% improvements in cooling performance of the fluid circuit 120 and the fluid circuit 220 respectively. This ensures that the temperature of the coolant remains sufficiently low, before it reaches each of the servers in the rack. As a result, heat from the heat-generating components in all parts of the computing device can continue to be effectively removed.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A rack of servers, the rack comprising:
a fluid conduit configured to flow a coolant therethrough, the fluid conduit being positioned with the rack and including portions in which the coolant flows distinctly as a heated coolant, a standby coolant, and a target coolant;
a plurality of heat-generating components in thermal communication with the fluid conduit, the plurality of heat-generating components being included in the servers and causing the heated coolant;
a heat-exchanging module fluidly coupled with the fluid conduit to receive the heated coolant from the plurality of heat-generating components, the heat-exchanging module being positioned within the rack and configured to cool the heated coolant into the standby coolant, the standby coolant having a cooler temperature than the heated coolant; and
a cooling module mounted within the rack and including
a heat-exchanger fluidly coupled with the heat exchanging module, the heat-exchanger receiving the standby coolant from the heat-exchanging module, and
a chiller fluidly coupled with the heat-exchanger to receive the standby coolant, the chiller being configured to cool the standby coolant into a target coolant, the target coolant having a lower temperature than the standby coolant, the chiller including
a manifold configured to circulate a refrigerant to cool the standby coolant into the target coolant,
a radiator coupled to the manifold and configured to remove heat from the refrigerant flowing through the manifold,
a compressor coupled to the manifold and configured to drive the refrigerant into the radiator, and
an expansion valve coupled to the manifold and configured to control flow of the refrigerant from the radiator to the compressor.

2. The rack of claim 1, wherein the cooling module further has an inlet pipe for delivering the cooling fluid from the chiller to the heat-exchanger.

3. The rack of claim 2, wherein the cooling module further has a pump fluidly coupled to the inlet pipe for driving the cooling fluid from the chiller to the heat-exchanger.

4. The rack of claim 2, wherein the cooling module further has an outlet pipe for removing the cooling fluid from the heat-exchanger to the chiller.

5. The rack of claim 1, wherein the cooling module further has an outlet pipe for removing the cooling fluid from the heat-exchanger to the chiller.

6. The rack of claim 1, wherein the warm coolant is water delivered at a temperature of less than about 10 degrees Celsius.

7. The rack of claim 1, further comprising a control unit communicatively coupled with the cooling module, the control unit being configured to execute operation of the cooling module.

8. The rack of claim 7, wherein the control unit is physically located in a distribution unit of a server.

9. The rack of claim 7, wherein the control unit is a baseboard management controller (BMC) in each server of a computing system.

10. The rack of claim 7, wherein the control unit is configured to operate the chiller to cool down a coolant temperature if an inlet temperature of the heat-exchanger is greater than a starting temperature of the chiller.

11. A system comprising:
a rack of servers;
a fluid circuit configured to flow a coolant for cooling the rack of servers, the fluid circuit being positioned with the rack and including portions in which the coolant flows distinctly as a heated coolant, a standby coolant, and a target coolant;
a plurality of heat-generating components in thermal communication with the fluid circuit, the plurality of heat-generating components being included in the servers and causing the heated coolant;
a heat-exchanging module fluidly coupled with the fluid circuit to receive the heated coolant from the plurality of heat-generating components, the heat-exchanging module being positioned within the rack and configured to cool the heated coolant into the standby coolant, the standby coolant having a cooler temperature than the heated coolant;
one or more cooling modules mounted within the rack and thermally connected to the fluid circuit, each cooling module having
a heat-exchanger fluidly coupled with the heat-exchanging module, the heat-exchanger receiving the standby coolant from the heat-exchanging module,
a chiller fluidly coupled with the heat-exchanger to receive the standby coolant, the chiller being configured to cool the standby coolant into a target coolant, the target coolant having a lower temperature than the standby coolant, the chiller including
a manifold configured to circulate a refrigerant to cool the standby coolant into the target coolant,
a radiator coupled to the manifold and configured to remove heat from the refrigerant flowing through the manifold, and
a compressor coupled to the manifold and configured to drive the refrigerant into the radiator;
an inlet pipe for delivering the target coolant from the chiller to the heat exchanger; and
an outlet pipe for removing the standby coolant cooling fluid from the heat-exchanger to the chiller.

12. The system of claim 11, further comprising:
a heat-exchanging module fluidly connected to an outlet of the fluid circuit; and
a pump configured to drive the target coolant from the heat-exchanging module to each server in the rack of servers.

13. The system of claim 11, wherein the chiller further includes an expansion valve coupled to the manifold and configured to control flow of the refrigerant from the radiator to the compressor.

14. The system of claim 11, further comprising a control unit communicatively coupled with the one or more cooling modules, the control unit being configured to execute operation of each one of the one or more cooling modules.

15. The system of claim 14, wherein the control unit is physically located in a distribution unit of a server in the rack of servers.

16. The system of claim 14, wherein the control unit is a baseboard management controller (BMC) in each server located in the rack of servers.

17. The system of claim 14, wherein the control unit is configured to operate the chiller to cool down a coolant temperature if an inlet temperature of the heat-exchanger is greater than a starting temperature of the chiller.

18. The system of claim 11, wherein the standby coolant is water delivered at a temperature of less than about 10 degrees Celsius.

* * * * *